US010394251B2

(12) United States Patent
Dierker et al.

(10) Patent No.: US 10,394,251 B2
(45) Date of Patent: Aug. 27, 2019

(54) CLOUD-BASED CONNECTIVITY ENERGY BUDGET MANAGER

(71) Applicant: FORD GLOBAL TECHNOLOGIES, LLC, Dearborn, MI (US)

(72) Inventors: William Dierker, Canton, MI (US); Douglas B. Thornburg, Dearborn, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/493,358

(22) Filed: Apr. 21, 2017

(65) Prior Publication Data

US 2018/0307244 A1    Oct. 25, 2018

(51) Int. Cl.
| | |
|---|---|
| G05D 1/02 | (2006.01) |
| G05D 1/00 | (2006.01) |
| G01R 31/36 | (2019.01) |
| H02J 7/00 | (2006.01) |
| G01R 31/387 | (2019.01) |
| H04W 4/80 | (2018.01) |
| H04L 29/08 | (2006.01) |
| H04W 4/60 | (2018.01) |
| H04W 4/44 | (2018.01) |

(52) U.S. Cl.
CPC ......... *G05D 1/0276* (2013.01); *G01R 31/387* (2019.01); *G05D 1/0011* (2013.01); *H02J 7/0063* (2013.01); *H02J 2007/0067* (2013.01); *H04L 67/10* (2013.01); *H04W 4/44* (2018.02); *H04W 4/60* (2018.02); *H04W 4/80* (2018.02)

(58) Field of Classification Search
CPC ... G05D 1/0276; G05D 1/0011; H02J 7/0063; H02J 7/0067; H04W 4/80; H04W 4/008; H04L 67/10
See application file for complete search history.

(56) References Cited

U.S. PATENT DOCUMENTS

| | | | |
|---|---|---|---|
| 8,212,527 B2 | 7/2012 | Zhang et al. | |
| 8,483,705 B1* | 7/2013 | Cope | H04W 4/043 370/352 |
| 9,187,007 B2 | 11/2015 | Li et al. | |
| 9,645,969 B2* | 5/2017 | Tagawa | G06F 17/00 |
| 9,692,240 B2* | 6/2017 | Brockman | H01M 10/4257 |
| 9,743,238 B2* | 8/2017 | Venkatraman | H04W 4/21 |
| 2007/0112475 A1* | 5/2007 | Koebler | B60L 3/12 701/1 |
| 2008/0271937 A1* | 11/2008 | King | B60W 20/10 180/165 |
| 2010/0094496 A1* | 4/2010 | Hershkovitz | B60L 3/12 701/22 |
| 2010/0102630 A1* | 4/2010 | Turski | H02J 7/0032 307/10.7 |

(Continued)

*Primary Examiner* — Tuan C To
(74) *Attorney, Agent, or Firm* — Frank L. Lollo; Brooks Kushman P.C.

(57) ABSTRACT

A storage maintains energy estimates corresponding to function requests for vehicles. A processor of a server is programmed to receive a function request for a vehicle, and direct the vehicle to perform the function request responsive to determining, according to battery information received from the vehicle and an energy estimate corresponding to the function request, that the vehicle has sufficient energy to perform the function request.

11 Claims, 4 Drawing Sheets

(56) References Cited

U.S. PATENT DOCUMENTS

| | | | |
|---|---|---|---|
| 2011/0060495 A1* | 3/2011 | Kono | G01C 21/3469 701/31.4 |
| 2011/0208428 A1* | 8/2011 | Matsubara | G01C 21/367 701/532 |
| 2012/0119747 A1* | 5/2012 | Sauerwine | G01R 31/362 324/432 |
| 2012/0166012 A1* | 6/2012 | Lee | B60L 53/65 700/297 |
| 2012/0265397 A1* | 10/2012 | Aliberti | B60L 11/1851 701/34.4 |
| 2013/0173084 A1* | 7/2013 | Tagawa | G06F 17/00 701/1 |
| 2014/0163777 A1* | 6/2014 | Yashiro | B60L 1/003 701/2 |
| 2014/0379174 A1* | 12/2014 | Holub | B60R 25/00 701/2 |
| 2016/0009188 A1* | 1/2016 | Yokoyama | B60L 1/003 701/22 |
| 2016/0089994 A1* | 3/2016 | Keller | H02J 7/045 320/153 |
| 2016/0246303 A1* | 8/2016 | Chinomi | G06Q 10/06 |
| 2016/0303983 A1* | 10/2016 | Rotay | B60L 11/1809 |
| 2017/0150531 A1* | 5/2017 | Horbatt | H04W 24/02 |
| 2017/0200994 A1* | 7/2017 | Kim | H01M 10/625 |
| 2017/0300313 A1* | 10/2017 | Gantt, Jr. | G06F 8/65 |
| 2018/0096539 A1* | 4/2018 | Merg | G07C 5/008 |
| 2018/0188332 A1* | 7/2018 | Newman | G01R 31/3689 |

* cited by examiner

CLOUD-BASED CONNECTIVITY ENERGY BUDGET MANAGER

TECHNICAL FIELD

Aspects of the disclosure generally relate to a cloud-based energy budget manager for connectivity functions.

BACKGROUND

A battery of a vehicle starts to discharge when the vehicle engine is turned off. Sometimes vehicles are left to sit for weeks at a time. However, the battery may become overly discharged if the battery is not periodically recharged, e.g., by restarting of the vehicle. The owner of the vehicle may return after several weeks and may find that the state of charge of the battery is insufficient to restart the vehicle.

SUMMARY

In one or more illustrative embodiments, a system includes a storage maintaining energy estimates corresponding to function requests for vehicles; and a processor of a server, programmed to receive a function request for a vehicle, and direct the vehicle to perform the function request responsive to determining, according to battery information received from the vehicle and an energy estimate corresponding to the function request, that the vehicle has sufficient energy to perform the function request.

In one or more illustrative embodiments, a method includes sending battery information of a vehicle including state of charge and instant current draw to a remote server; receiving a function request from the server responsive to the server determining, according to the battery information and energy estimate corresponding to the function request, that the vehicle has sufficient energy to perform the function request; and sending further battery information for updating the energy estimate to the server after completing the function request.

In one or more illustrative embodiments, a system includes a processor programmed to utilize battery information received from a vehicle responsive to completion of a function request by the vehicle to compute an updated energy estimate corresponding to the function request, the energy estimate being used to confirm that battery state of charge is adequate to perform the function request in the future.

DETAILED DESCRIPTION

Figure 1:
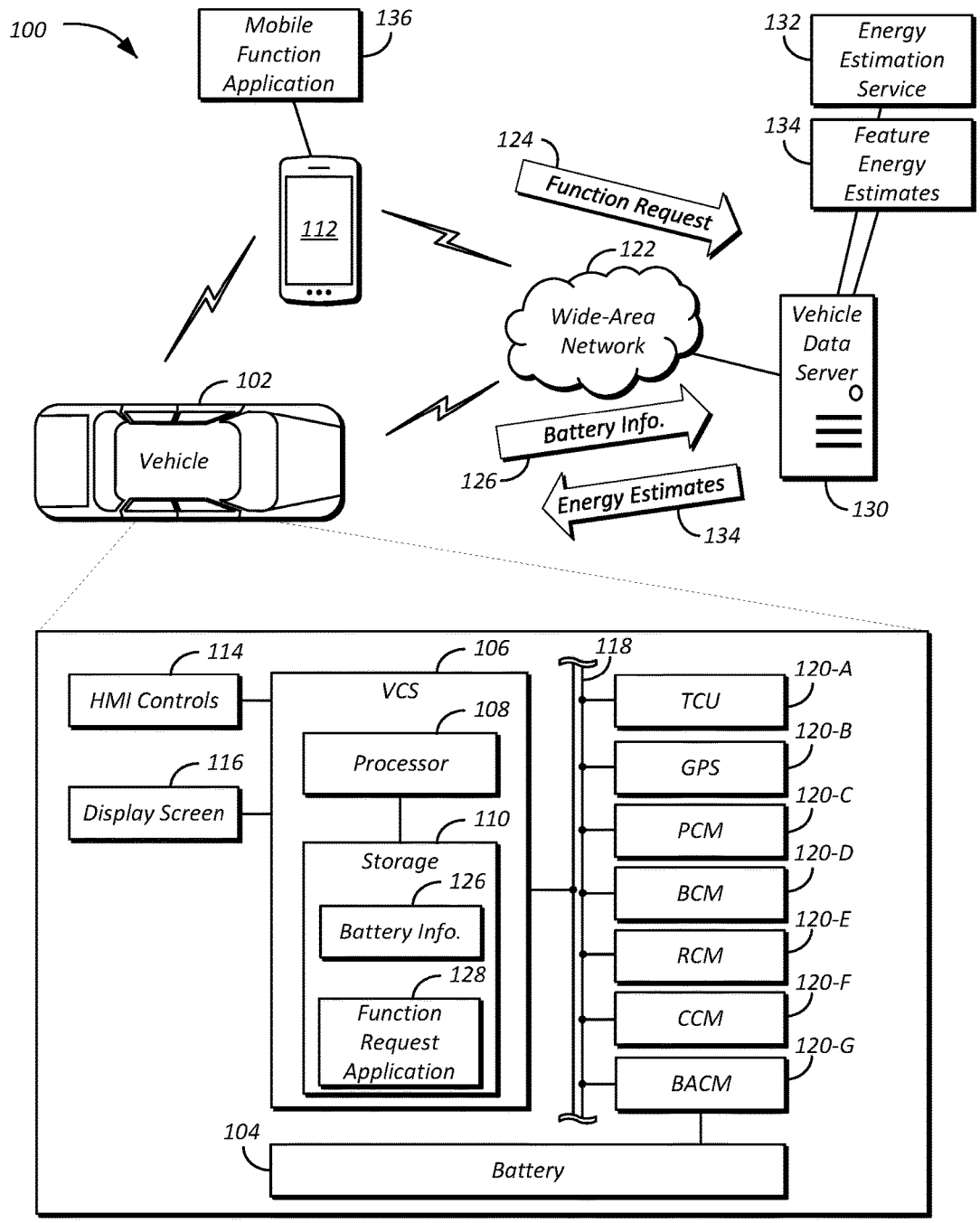
FIG. 1 illustrates an example system implementing cloud-based energy budget management for remote function requests.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The addition of a modem to a vehicle adds capabilities to access and perform many features when the vehicle is in a key-off state. These features may include the performance of software updates or the offloading of data collected by the vehicle. Features such as these require stored energy of the vehicle to operate. Because of the energy usage requirements, use of these features affects the state of charge of the vehicle battery. If the state of charge dips too low, the vehicle may become unable to be restarted.

Some implementations can estimate energy used by a function, perform some verification testing, and size a battery and distribute energy based on these values within program constraints. However, design-time techniques fail to provide a capability to easily add new features. Moreover, such static techniques fail to provide a real-world indication of the actual health of the battery or of the actual energy being used or available at a given time. Thus, such approaches still run the risk of draining the vehicle battery, or, if current consumption is overestimated for the features, unnecessarily limiting key-off function availability.

In an improved implementation, a cloud-based energy level budget manager may be designed to track available energy. Available energy may be tracked utilizing battery State of Charge (SoC), models utilizing data obtained during verification testing, as well as vehicle/fleet operational data. Prior to initiating a vehicle function in key-off mode via the server, an energy budget corresponding to the requested feature is compared to the energy required for the feature. If sufficient energy is available, the server will access the vehicle and power those modules necessary to perform the feature. Within a predefined number of seconds after power up, vehicle battery current sensors may monitor and send to the server the actual energy being used, so that the server can adjust and decide whether to proceed or reject the function request at that time. The energy usage value stored in the cloud for that feature may be updated based on actual vehicle measurements of energy used to complete the feature When a function request is received by a vehicle, a current SoC of the vehicle is compared to an up-to-date energy usage value for that vehicle. If the SoC can support that energy usage, a power up request for the feature will be sent to the vehicle. Within a predefined number of seconds of vehicle power up, the vehicle may measure and send back to the server battery information indicative of the amount of current being used at that time as well as an updated SoC. This battery information may then be used by the server to determine whether any extra or unexpected devices are powered. This value may further be compared to the energy estimate required for use of the feature before proceeding with invoking the feature.

FIG. 1 illustrates an example system 100 implementing cloud-based energy budget management for remote function requests 124. The vehicle 102 includes a battery 104 to power various vehicle functions during key-off, and a vehicle computing system (VCS) 106 configured to communicate over a wide-area network 122, e.g., using a telematics control unit (TCU) 120-A. The system 100 also includes a vehicle data server 130 configured to maintain feature energy estimates 134 indicative of the amounts of energy required by a vehicle 102 to perform the corresponding functions. The vehicle data server 130 executes an energy estimation service 132 configured to update the feature energy estimates 134 based on battery information 126 received over the wide-area network 122 from the vehicle 102. A mobile device 112 associated with the vehicle 102 (or other device) provides function requests 124 to the vehicle data server 130, which may be forwarded to the VCS 106 of the vehicle 102 if the feature energy estimates 134 indicate that sufficient vehicle 102 energy is available. The VCS 106 utilizes a function request application 128 installed to the VCS 106 to report the battery information 126 regarding the battery 104 to the vehicle data server 130 to allow for updating of the feature energy estimates 134, and to respond to function requests 124 to perform the requested operations. While an example system 100 is shown in FIG. 1, the example components as illustrated are not intended to be limiting. Indeed, the system 100 may have more or fewer components, and additional or alternative components and/or implementations may be used.

The vehicle 102 may include various types of automobile, crossover utility vehicle (CUV), sport utility vehicle (SUV), truck, recreational vehicle (RV), boat, plane or other mobile machine for transporting people or goods. In many cases, the vehicle 102 may be powered by an internal combustion engine. As another possibility, the vehicle 102 may be a hybrid electric vehicle (HEV) powered by both an internal combustion engine and one or more electric motors, such as a series hybrid electric vehicle (SHEV), a parallel hybrid electrical vehicle (PHEV), or a parallel/series hybrid electric vehicle (PSHEV). As the type and configuration of vehicle 102 may vary, the capabilities of the vehicle 102 may correspondingly vary. As some other possibilities, the vehicle 102 may have different capabilities with respect to passenger capacity, towing ability and capacity, and storage volume.

The battery 104 may include various types of rechargeable batteries configured to supply electric energy to various components of the vehicle 102 (such as the controller(s) 120). In an example, the battery 104 may be a 12 Volt lead-acid battery. The battery 104 may be configured to power a starter motor and ignition system of an engine of the vehicle 102 when the engine is not running, and may receive electric charge from an alternator when the engine is running. In another example, the battery 104 may include a traction battery or battery pack configured to store energy that can be used by one or more electric machines of the vehicle 102 that can provide propulsion and deceleration capability, whether the engine is turned on or off.

The VCS 106 may be configured to support voice command and BLUETOOTH interfaces with the driver and driver carry-on devices, receive user input via various buttons or other controls, and provide vehicle status information to a driver or other vehicle 102 occupants. An example VCS 106 may be the SYNC system provided by FORD MOTOR COMPANY of Dearborn, Mich.

The VCS 106 may further include various types of computing apparatus in support of performance of the functions of the VCS 106 described herein. In an example, the VCS 106 may include one or more processors 108 configured to execute computer instructions, and a storage 110 medium on which the computer-executable instructions and/or data may be maintained. A computer-readable storage medium (also referred to as a processor-readable medium or storage 110) includes any non-transitory (e.g., tangible) medium that participates in providing data (e.g., instructions) that may be read by a computer (e.g., by the processor(s)). In general, a processor 108 receives instructions and/or data, e.g., from the storage 110, etc., to a memory and executes the instructions using the data, thereby performing one or more processes, including one or more of the processes described herein. Computer-executable instructions may be compiled or interpreted from computer programs created using a variety of programming languages and/or technologies, including, without limitation, and either alone or in combination, Java, C, C++, C#, Fortran, Pascal, Visual Basic, Python, Java Script, Perl, PL/SQL, etc.

The VCS 106 may be configured to communicate with mobile devices 112 of the vehicle occupants. The mobile devices 112 may be any of various types of portable computing devices, such as cellular phones, tablet computers, smart watches, laptop computers, portable music players, or other devices capable of communication with the VCS 106. As with the VCS 106, the mobile device 112 may include one or more processors configured to execute computer instructions, and a storage medium on which the computer-executable instructions and/or data may be maintained. In many examples, the VCS 106 may include a wireless transceiver (e.g., a BLUETOOTH controller, a ZIGBEE transceiver, a Wi-Fi transceiver, etc.) configured to communicate with a compatible wireless transceiver of the mobile device 112. Additionally, or alternately, the VCS 106 may communicate with the mobile device 112 over a wired connection, such as via a USB connection between the mobile device 112 and a USB subsystem of the VCS 106.

The VCS 106 may also receive input from human-machine interface (HMI) controls 114 configured to provide for occupant interaction with the vehicle 102. For instance, the VCS 106 may interface with one or more buttons or other HMI controls 114 configured to invoke functions on the VCS 106 (e.g., steering wheel audio buttons, a push-to-talk button, instrument panel controls, etc.). The VCS 106 may also drive or otherwise communicate with one or more displays 116 configured to provide visual output to vehicle occupants, e.g., by way of a video controller. In some cases, the display 116 may be a touch screen further configured to receive user touch input via the video controller, while in other cases the display 116 may be a display only, without touch input capabilities. In an example, the display 116 may be a head unit display included in a center console area of the vehicle 102 cabin. In another example, the display 116 may be a screen of a gauge cluster of the vehicle 102.

The VCS 106 may be further configured to communicate with other components of the vehicle 102 via one or more in-vehicle networks 118 or vehicle buses 118. The in-vehicle networks 118 may include one or more of a vehicle controller area network (CAN), an Ethernet network, and a media oriented system transfer (MOST), as some examples. The in-vehicle networks 118 may allow the VCS 106 to communicate with other vehicle 102 systems, such as a vehicle modem of the TCU 120-A, a global positioning system (GPS) module 120-B configured to provide current vehicle 102 location and heading information, and various other vehicle ECUs configured to cooperate with the VCS 106. As some non-limiting possibilities, the vehicle ECUs may include a powertrain control module (PCM) 120-C configured to provide control of engine operating components (e.g., idle control components, fuel delivery components, emissions control components, etc.) and monitoring of engine operating components (e.g., status of engine diagnostic codes); a body control module (BCM) 120-D configured to manage various power control functions such as exterior lighting, interior lighting, keyless entry, remote start, and point of access status verification (e.g., closure status of the hood, doors and/or trunk of the vehicle 102); a radio transceiver module (RCM) 120-E configured to communicate with key fobs or other local vehicle 102 devices; a climate control management (CCM) 120-F module configured to provide control and monitoring of heating and cooling system components (e.g., compressor clutch and blower fan control, temperature sensor information, etc.); and a battery control module (BACM) 120-G configured to monitor the state of charge or other parameters of the battery 104 of the vehicle 102.

The wide-area network 122 may include one or more interconnected communication networks such as the Internet, a cable television distribution network, a satellite link network, a local area network, a wide area network, and a telephone network, as some non-limiting examples.

The TCU 120-A may include a cellular modem or other network transceiver configured to facilitate communication over the wide-area network 122 between the vehicle 102 and other devices of the system 100. In an example, the VCS 106 may be configured to access the communications features of the TCU 120-A by communicating with the TCU 120-A over a vehicle bus 118. As some examples, the vehicle bus 118 may include a controller area network (CAN) bus, an Ethernet bus, or a MOST bus. In other examples, the VCS 106 may access the wide-area network 122 using the communications services of the mobile device 112. In an example, the VCS 106 may communicate with the mobile device 112 over a local area connection (e.g., BLUETOOTH), and the mobile device 112 in turn communicates over the wide-area network 122 using a cellular modem of the mobile device 112. Thus, using the embedded modem of the TCU 120-A (or a mobile device 112 of the user connected to the VCS 106), the VCS 106 of the vehicle 102 may be able to send outgoing data from the vehicle 102 to network destinations on the wide-area network 122, and receive incoming data to the vehicle 102 from network destinations on the wide-area network 122.

The function requests 124 may include requests for capabilities of the vehicle 102 that are to be accessed and performed when the vehicle 102 is at key-off. These features may include, as some examples, the performance of software update, or the offloading of data collected by the vehicle. Features such as these require stored energy of the vehicle to operate. Because of the energy usage requirements, use of these features affects the state of charge of the vehicle battery 104. If the state of charge of the battery 104 dips too low, the vehicle 102 may become unable to be restarted.

The battery information 126 may include data indicative of the current SoC of the battery 104. The battery information 126 may additionally or alternately include data indicative of the current battery drain rate of the battery 104. Additionally or alternatively, the battery information 126 may include data indicative of throughput. Battery throughput may provide an aging indication of the battery 104, and therefore may affect the amount of energy that is available. In an example, the BACM 120-G may generate the battery information 126 based on its connection to the battery 104. The VCS 106 may be configured to query the BACM 120-G for the battery information 126 via the vehicle bus 118, and may receive the battery information 126 from the BACM 120-G over the vehicle bus 118.

The function request application 128 may be one application included on the storage 110 of the VCS 106. The function request application 128 may include instructions that, when executed by the processor of the VCS 106, cause the VCS 106 to send the battery information 126 from the vehicle 102 to the vehicle data server 130. The function request application 128 may also include instructions for performing functions in response to receipt of function requests 124 by the vehicle 102 (e.g., via the TCU 120-A).

The vehicle data server 130 may include various types of computing apparatus, such as a computer workstation, a server, a desktop computer, a virtual server instance executed by a mainframe server, or some other computing system and/or device. Similar to the VCS 106, the vehicle data server 130 generally includes a memory on which computer-executable instructions may be maintained, where the instructions may be executable by one or more processors (not shown for clarity). Such instructions and other data may be stored using a variety of computer-readable media.

The vehicle data server 130 may maintain an energy estimation service 132. The energy estimation service 132 may include instructions that, when executed by a processor of the vehicle data server 130, cause the vehicle data server 130 to receive the battery information 126, and generate feature energy estimates 134 based on the received information. For instance, the energy estimation service 132 may determine an amount of energy required by the vehicle 102 to perform a function request 124, based on battery information 126 received before and after a function request 124 is performed. These amounts of energy required to perform the function requests 124 may be referred to as energy estimates 134, and may be maintained by a storage of the vehicle data server 130 (or by another storage in communication with the vehicle data server 130). In an example, the energy estimates 134 may be computed individually for a specific vehicle 102. In another example, the energy estimates 134 may be computed as an average across a make and model of vehicle 102. In yet a further example, the energy estimates 134 may be computed across multiple makes and models of vehicle 102.

The energy estimation service 132 may further include instructions to provide the energy estimates 134 for function requests 124 to the vehicle 102 to allow the vehicle 102 to confirm whether the vehicle 102 has sufficient battery 104 reserve to perform a received function request 124.

The mobile function application 136 may further provide an option allowing the user to send function requests 124 to the vehicle 102. For instance, the mobile function application 136 may display a user interface to a display of the mobile device 112, including a control that, when selected, causes the mobile function application 136 to direct the mobile device 112 to send a function request 124 to the vehicle 102.

As some non-limiting examples, the function requests 124 may include requests for retrieving logged vehicle 102 information from the vehicle 102, checking for the availability of software updates, performing vehicle health checks, or sending custom bus commands to be provided over the vehicle bus 118 of the vehicle 102, As some other non-limiting possibilities, the function requests 124 may include routines for monitoring spark plug health, monitoring vehicle 102 emissions, and performing a brake system health test.

Figure 2:
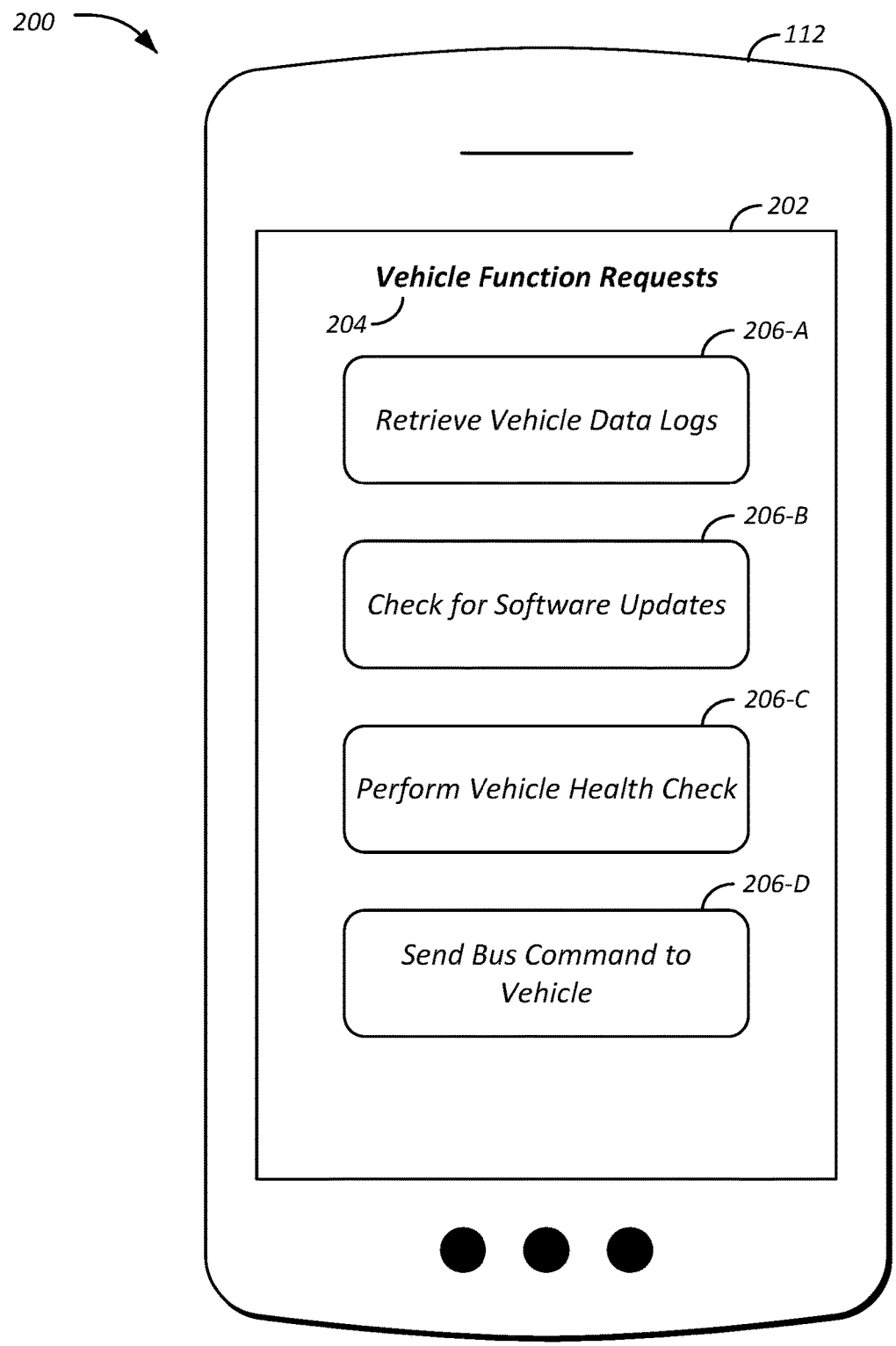
FIG. 2 illustrates an example user interface of the mobile device for providing remote function requests to the vehicle.

FIG. 2 illustrates an example user interface 200 of the mobile function application 136 displaying a listing of available vehicle function requests 124. The user interface 200 may be presented by the mobile function application 136 on a display 202 of the mobile device 112. The user interface 200 may be invoked, in an example, responsive to user selection of an icon invoking execution of the mobile function application 136 from a home screen of the mobile device 112. The title label 204 may indicate to the user that the user interface 200 is displaying the vehicle function requests 124 available via the mobile function application 136. Moreover, the user interface 200 may include a set of function controls 206 from which the user may select available function requests 124 to be performed by the vehicle 102.

In one example, the available function requests 124 may be hardcoded to the mobile function application 136. In another example, the available function requests 124 may be determined based on the make and model of the vehicle 102 to be controlled. In yet a further example, the available function requests 124 may be requested by the mobile function application 136 from the vehicle data server 130. Regardless of approach, the available function requests 124 may be provided in the user interface 200 for selection by the user.

As shown, the function control 206-A invokes a retrieval of vehicle data logs when selected, the function control 206-B invokes a check for software updates when selected, the function control 206-C invokes performance of a vehicle health check when selected, and the function control 206-D invokes sending a bus command over the vehicle bus 118 of the vehicle 102 when selected. If one of the function controls 206 is selected, the mobile device 112 may send a function request 124 to the vehicle data server 130 for processing.

Figure 3:
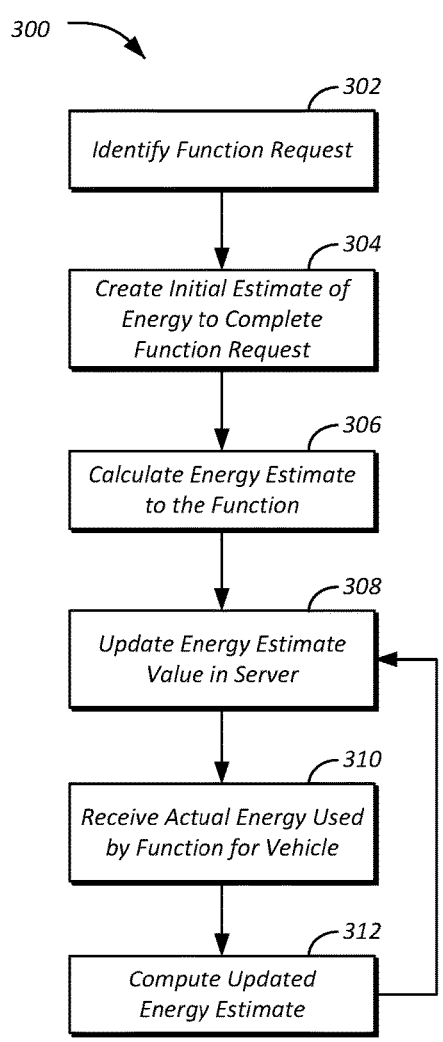
FIG. 3 illustrates an example process for the computation of feature energy estimates.

FIG. 3 illustrates an example process 300 for the computation of feature energy estimates 134. In an example, the process 300 may be performed by the energy estimation service 132 executed by the vehicle data server 130.

At operation 302, the vehicle data server 130 identifies a function request 124. In an example, the vehicle data server 130 creates an association of an identifier of a function to be provided in function requests 124 with a storage record for that identifier of the function request 124.

At 304, the vehicle data server 130 creates an initial energy estimate 134 of the energy required to complete the function request 124. In an example, the vehicle data server 130 may receive information from vehicle 102 verification testing performed for a new vehicle 102 make or model. The verification testing may include actual laboratory tested energy usages for features, or predicted feature time, indications of vehicle components 120 that need to be activated to support the feature, and energy draw per unit time measurements for the vehicle components 120.

The vehicle data server 130 calculates an energy estimate 134 for the requested function at 306. In an example, the vehicle data server 130 may determine an energy requirement according to the amount of estimated current draw for the vehicle components 120 activated to perform the function, multiplied by the estimated amount of time during which the draw is required.

At operation 308, the vehicle data server 130 updates the energy usage value at the server. In an example, the vehicle data server 130 saves the calculated energy estimate 134 in a storage of the vehicle data server 130 or in a storage otherwise accessible to the vehicle data server 130. In an example, the energy estimates 134 may be computed individually for a specific vehicle 102. In another example, the energy estimates 134 may be computed as an average across a make and model of vehicle 102. In yet a further example, the energy estimates 134 may be computed across multiple makes and models of vehicle 102.

At 310, the vehicle data server 130 receives actual energy used by the function at the vehicle 102. In an example, the vehicle data server 130 receives the actual energy used information from the vehicle 102 having performed the function request 124. The actual energy used information may include, in an example, one or more of: a SoC of the battery 104 before the feature was performed, a SoC of the battery 104 after the feature was performed, instant current draw rate of the vehicle 102 during performance of the feature, and time taken to perform the feature.

The vehicle data server 130 computes an updated energy estimate 134 for the function at operation 312. In an example, the vehicle data server 130 averages the received actual energy usage with that of the currently stored energy estimate 134 for the feature. In another example, the vehicle data server 130 replaces the currently-stored energy estimate 134 for the feature with the received actual energy usage for the feature. In yet a further example, the average of the energy estimate 134 is computed as an average of the energy usage for one of the specific vehicle 102, the make and model of vehicle 102, and across multiple makes and models of vehicle 102. After operation 312, control returns to operation 308.

Figure 4:
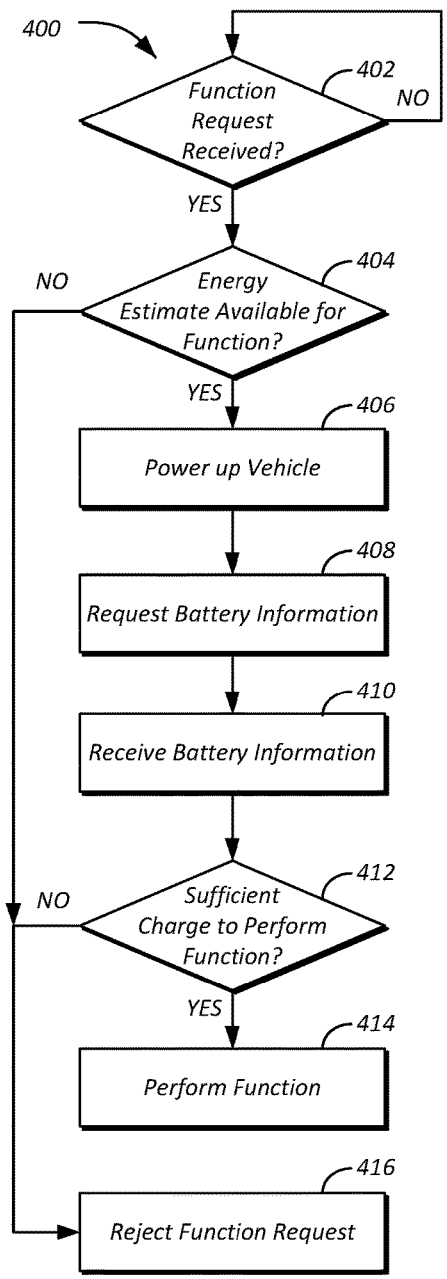
FIG. 4 illustrates an example process for cloud-based energy budget management for remote function requests.

FIG. 4 illustrates an example process 400 for cloud-based energy budget management for remote function requests 124. In an example, the process 400 may also be performed by the energy estimation service 132 executed by the vehicle data server 130.

At operation 402, the vehicle data server 130 determines whether a function request 124 was received. In an example, the vehicle data server 130 receives a function request 124 from the mobile device 112 as illustrated with respect to FIG. 3. If a function request was received, control passes to operation 404. Otherwise, control remains at operation 402.

At 404, the vehicle data server 130 determines whether an energy estimate 134 for the feature of the function request 124 is available. In an example, the vehicle data server 130 accesses storage to determine whether an energy estimate 134 has been completed for the feature of the function request 124. For instance, the vehicle data server 130 may attempt to lookup in the storage an identifier included in the function request 124. Further aspects of the determination of energy estimates 134 are described above with regard to the process 300. If an energy estimate 134 for the feature of the function request 124 is available, control passes to operation 406. If not, control passes to operation 416.

The vehicle data server 130 powers up the vehicle 102 at operation 406. In an example, the vehicle data server 130 sends a message via TCU 120-A of the vehicle 102 that, when received, is forwarded over the vehicle bus 118 or other vehicle network to the function request application 128 of the VCS 106 of the vehicle 102. The power up request may include further information, such as indications of which vehicle components 120 should be powered up to complete the function request 124. In another example, the power up request includes the indication of the specific function request 124 to be performed, such that the vehicle 102 (e.g., the function request application 128 of the VCS 106), identifies which vehicle components 120 are to be powered up.

At operation 408, the vehicle data server 130 requests battery information 126 from the vehicle 102. In an example, the vehicle data server 130 may send a further request to the vehicle 102 for the battery information 126 a predefined period of time after the sending of the power up request, while in other examples, the power up request for the vehicle 102 further causes the vehicle 102 to be requested to provide the battery information 126. The battery information 126 that is requested may include a current state of charge of the battery 104, and/or a current drain level of the vehicle 102 as powered-up. The vehicle data server 130 receives the battery information 126 from the vehicle 102 at 410.

At 412, the vehicle data server 130 determines whether the vehicle 102 has sufficient charge to perform the function of the function request 124. In an example, the vehicle data server 130 may confirm that the current SoC from the battery information 126 has sufficient charge to perform the function of the function request 124 based on the current drain level of the vehicle 102. If no current drain level is provided, the vehicle data server 130 may confirm that the current SoC from the battery information 126 is sufficient according to the energy estimate 134 for the feature of the function request 124. If sufficient energy is available, control passes to operation 414. Otherwise, control passes to operation 416.

At operation 414, the vehicle data server 130 directs the vehicle 102 to perform the requested function of the function request 124. In an example, the vehicle data server 130 sends a message to the vehicle 102 indicating the function to be performed. In another example, the vehicle data server 130 sends a message to the vehicle 102 indicating that the function specified by the power up request sent at operation 406 is to be performed. After operation 414, the process 400 ends (or returns to operation 402, not shown).

At 416, the vehicle data server 130 rejects the function request 124. After operation 414, the process 400 ends (or returns to operation 402, not shown). In some cases, if the function request 124 is denied, the vehicle data server 130 may send a message to the mobile device 112 indicating that the vehicle 102 lacks sufficient energy in the battery 104 to perform the requested function.

Figure 5:
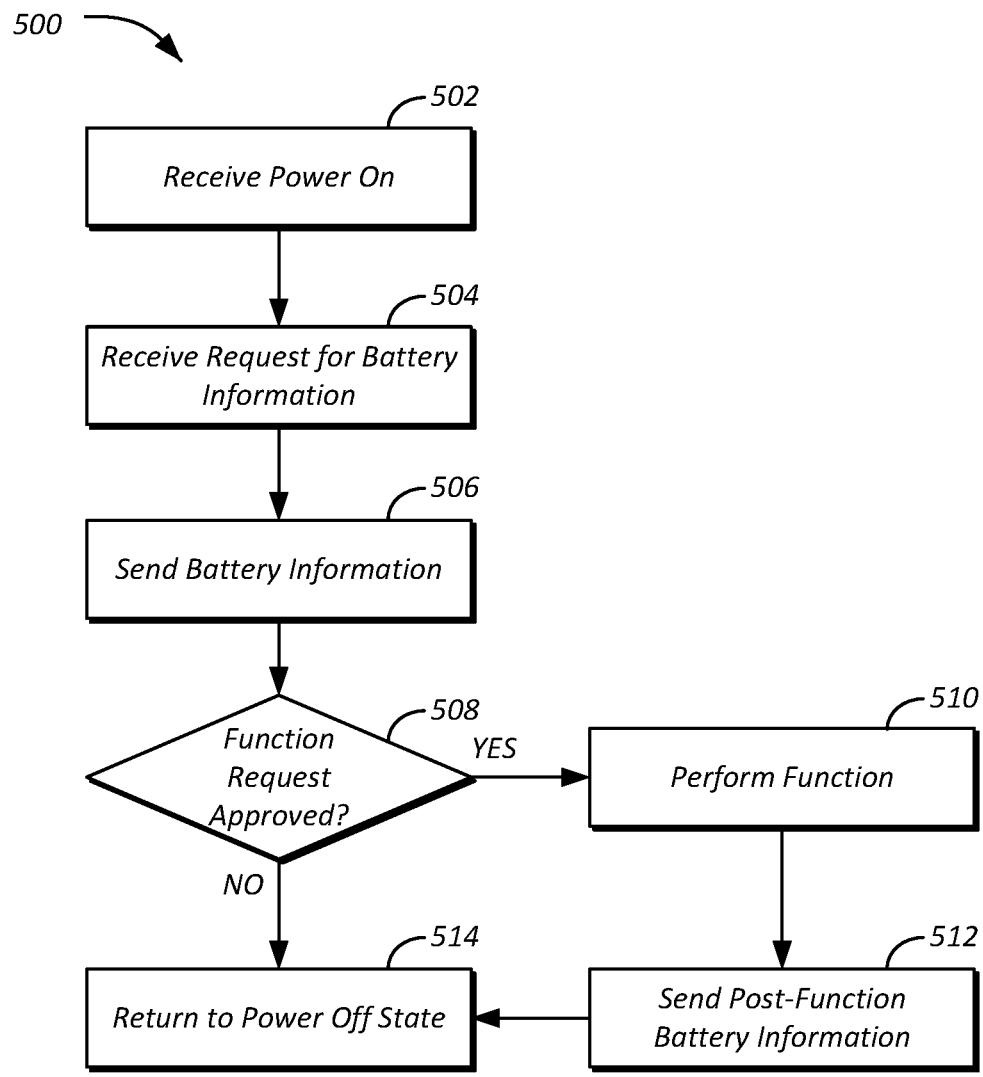
FIG. 5 illustrates an example process for a vehicle performing cloud-based energy budget management for remote function requests.

FIG. 5 illustrates an example process 500 for a vehicle 102 performing cloud-based energy budget management for remote function requests 124. In an example, the process 500 may be performed by the function request application 128 executed by the VCS 106 of the vehicle 102.

At operation 502, the vehicle 102 receives a power on request. In an example, the power on request is received from the vehicle data server 130 as discussed above with respect to operation 406.

At operation 504, the vehicle 102 receives a request for battery information 126. In an example, the request for battery information 126 is received from the vehicle data server 130 as discussed above with respect to operation 408.

At operation 506, the vehicle 102 provides the battery information 126. In an example, the battery information 126 is received from the vehicle data server 130 as discussed above with respect to operation 410.

At operation 508, the vehicle 102 receives approval of execution of the function request 124. In an example, the approval is received from the vehicle data server 130 as discussed above with respect to operation 412. If approval is received, control passes to operation 510. If not, control passes to operation 514.

At operation 510, the vehicle 102 performs the requested function. In an example, the requested function may be retrieval of vehicle data logs, a check for software updates, performance of a vehicle health check, sending a bus command over the vehicle bus 118 of the vehicle 102, or another function.

At operation 512, the vehicle 102 sends battery information 126 to the vehicle data server 130 after the execution of the function at operation 510. In an example, the post-function battery information 126 is sent to the vehicle data server 130 as discussed above with respect to operation 310. This battery information 126 may accordingly be used by the vehicle data server 130 to revise the energy estimate 134.

At operation 514, the vehicle 102 returns to power off. In an example, the vehicle 102 ensures that any vehicle components 120 activated to perform the function request are again deactivated. After operation 514, the process 500 ends.

Computing devices described herein, such as the VCS 106, mobile device 112, ECUs 120, and vehicle data server 130, generally include computer-executable instructions where the instructions may be executable by one or more computing devices such as those listed above. Computer-executable instructions, such as those of the function request application 128 and mobile function application 136, may be compiled or interpreted from computer programs created using a variety of programming languages and/or technologies, including, without limitation, and either alone or in combination, Java™, C, C++, C#, Visual Basic, JavaScript, Python, JavaScript, Perl, PL/SQL, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It should further be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A system comprising:
a storage maintaining energy estimates corresponding to function requests; and
a processor of a server, programmed to
receive, from a mobile device, a function request for a vehicle at key-off,
send a power up message to the vehicle indicating one or more of (i) an identifier of the function request or (ii) a set of vehicle components required to perform the function request,
receive battery information from the vehicle responsive to the vehicle powering up a set of vehicle components required to perform the function request, and
direct the vehicle to perform the function request at key-off responsive to determining, according to the battery information received from the vehicle and an energy estimate corresponding to the function request, that the vehicle has sufficient energy to perform the function request,
wherein the battery information includes a state of charge of the vehicle and an instant current draw rate for the vehicle.

2. The system of claim 1, wherein the battery information received from the vehicle includes a state of charge of the vehicle and an instant current draw rate for the vehicle.

3. The system of claim 1, wherein the processor of the server is further programmed to:
responsive to determining that the vehicle lacks sufficient energy to perform the function request, send a message to the mobile device indicating that the function request cannot be completed.

4. The system of claim 1, wherein the processor of the server is further programmed to reject the function request responsive to determining that no energy estimate is available that corresponds to the function request.

5. The system of claim 1, wherein the processor of the server is further programmed to:
receive further battery information from the vehicle responsive to completion of the function request; and
utilize the further battery information to compute an updated energy estimate corresponding to the function request.

6. A system comprising:
a storage maintaining energy estimates corresponding to function requests; and
a processor of a server, programmed to
receive, from a mobile device, a function request for a vehicle at key-off,
create an energy estimate corresponding to the function request according to a predicted measure of time for execution of the function request, indications of vehicle components that are to be activated to support the function request, and energy draw per unit time measurements for the vehicle components, and
direct the vehicle to perform the function request at key-off responsive to determining, according to battery information received from the vehicle and the energy estimate, that the vehicle has sufficient energy to perform the function request.

7. A method comprising:
sending battery information of a vehicle including state of charge and instant current draw to a remote server;
receiving a function request from the server responsive to the server;
determining, according to the battery information and energy estimate corresponding to the function request, that the vehicle has sufficient energy to perform the function request at vehicle key-off; and
sending further battery information for updating the energy estimate to the server after completing the function request.

8. The method of claim 7, further comprising:
receiving a power up message, from the remote server, indicating an identifier of the function request; and
sending the state of charge and instant current draw, to the remote server, responsive to the vehicle powering up a set of vehicle components required to perform the function request.

9. The method of claim 8, further comprising powering off the set of vehicle components responsive to completion of the function request.

10. The method of claim 7, further comprising:
receiving a power up message, from the remote server, indicating a set of vehicle components required to perform the function request; and
sending the state of charge and instant current draw, to the remote server, responsive to the vehicle powering up the set of vehicle components required to perform the function request.

11. The method of claim 10, further comprising powering off the set of vehicle components responsive to completion of the function request.

* * * * *